(12) United States Patent
Fidalgo et al.

(10) Patent No.: US 6,548,888 B1
(45) Date of Patent: Apr. 15, 2003

(54) INTEGRATED CIRCUIT CARD COMPRISING AN INTERFACE TERMINAL STRIP AND METHOD FOR MAKING SAME

(75) Inventors: JeanChristophe Fidalgo, Gemenos (FR); Lucile Dossetto, La Ciotat (FR)

(73) Assignee: Gemplus, Gemenos (FR)

(*) Notice: Subject to any disclaimer, the term of this patent is extended or adjusted under 35 U.S.C. 154(b) by 0 days.

(21) Appl. No.: 09/700,392

(22) PCT Filed: May 17, 1999

(86) PCT No.: PCT/FR99/01167

§ 371 (c)(1),
(2), (4) Date: Nov. 14, 2000

(87) PCT Pub. No.: WO99/60519

PCT Pub. Date: Nov. 25, 1999

(30) Foreign Application Priority Data

May 15, 1998 (FR) .............................................. 98 06470

(51) Int. Cl.⁷ ................................................ H01L 23/02
(52) U.S. Cl. ........................ 257/679; 257/698; 438/125
(58) Field of Search ................. 257/679, 698, 257/787; 438/126, 127, 125

(56) References Cited

U.S. PATENT DOCUMENTS

| | | | |
|---|---|---|---|
| 4,603,249 A | * | 7/1986 | Hoppe et al. |
| 4,674,175 A | * | 6/1987 | Satmpfli |
| 4,835,846 A | | 6/1989 | Juan et al. |
| 5,005,282 A | | 4/1991 | Rose |
| 5,448,110 A | * | 9/1995 | Tuttle et al. |
| 5,574,309 A | * | 11/1996 | Papapietro |
| 6,301,119 B1 | * | 10/2001 | Thevenot et al. |
| 6,320,751 B2 | * | 11/2001 | Takeda et al. |
| 6,320,753 B1 | * | 11/2001 | Launay |
| 6,406,935 B2 | * | 6/2002 | Kayanakis et al. |
| 6,420,790 B1 | * | 7/2002 | Koizumi |
| 6,437,985 B1 | * | 8/2002 | Blanc et al. |

FOREIGN PATENT DOCUMENTS

| | | |
|---|---|---|
| EP | 0772232 | 5/1997 |
| FR | 2744271 | 12/1996 |
| FR | 2735256 | 8/1997 |

* cited by examiner

*Primary Examiner*—Sheila V. Clark
(74) *Attorney, Agent, or Firm*—Burns, Doane, Swecker & Mathis, LLP

(57) ABSTRACT

An integrated circuit card includes a card body having an integrated circuit electrically connected to contact pads formed by electrically conductive ink. An interface terminal strip provided with a series of terminals is electrically connected to the integrated circuit contacts. The contact pads are formed on the card body upper surface such that each pad comprises a portion which covers, at least partially, a terminal of the interface terminal strip.

11 Claims, 3 Drawing Sheets

INTEGRATED CIRCUIT CARD COMPRISING AN INTERFACE TERMINAL STRIP AND METHOD FOR MAKING SAME

This disclosure is based upon, and claims priority from French Patent Application No. 98/06470, filed May 15, 1998, and International Application No. PCT/FR99/01167, filed May 17, 1999, the contents of which are incorporated herein by reference.

An integrated circuit card with an interface terminal strip strip and a method of manufacturing such a card The invention relates to an integrated circuit card with an interface terminal strip between the integrated circuit and contact areas produced by the deposition of ink.

The invention relates more particularly to an integrated circuit card of the type having a card body in which there is arranged at least one integrated circuit electrically connected to contact areas on which contact blades of an operating circuit are intended to bear, and of the type in which the contact areas are formed by the deposition of a conductive ink.

In standard integrated circuit cards, an international standard defines notably the number, size and position of the contact areas with respect to the external edges of the card body so that a card in accordance with the standard can be used in a large number of types of apparatus having an operating circuit intended to exchange information with the integrated circuit contained in the card. Each of these items of equipment has for example a connector provided with a series of contact blades which are intended to come into abutment against the contact areas of a card engaged in the connector, the contact blades providing the electrical connection between the integrated circuit of the card and the operating circuit of the equipment.

According to the standard, the size of the contact areas is relatively large in order to guarantee with certainty that the blades of the connector come into contact on the areas on the card, without imposing excessively strict constraints with regard to the relative positioning of the card and connector.

In very many integrated circuit cards, the contact areas are produced by cutting a metallic plate, possibly coated with one or more precious metals intended to improve the quality of the electrical contact.

For the purpose of reducing the cost of integrated circuit cards, it has already been proposed to reduce the costs related to the cost of the material constituting the contacts. It has notably been proposed to produce integrated circuit cards whose contact areas are produced by the deposition of a conductive ink, for example by screen-printing, offset, flexographic printing, pad printing or any derived technology.

Thus integrated circuit cards are known in which the integrated circuit is directly implanted in the card body, one of its faces lying flush at the level of the top face of the card body, and in which both the contact areas and the connection means between the integrated circuit and the contact areas are produced by various screen-printing operations.

A first drawback of this technology is that the implantation of the integrated circuit in the card body must be effected with a great deal of precautions in order not to break it since it has no protection at that time. In addition the implantation of the integrated circuit must be effected with great precision, notably angular precision. This is because an angular error of 6 degrees on the chip will create a lack of parallelism of 1 mm on the contact areas. Another drawback is that the screen-printing operations which form the contact areas and connect them to the terminals of the integrated circuit are particularly tricky, notably with regard to the relative positioning of the integrated circuit and the contact areas. To ensure sufficient reliability of this operation, it is often necessary to use computer-aided artificial vision systems, in order to obtain a sufficiently precise positioning. However, the precision required for this screen-printing operation prevents it being carried out at a high rate, which extends the time taken for manufacturing the card and therefore its cost.

SUMMARY OF THE INVENTION

The object of the invention is therefore to propose a novel design of an integrated circuit card, and a novel method of manufacturing an integrated circuit card which make it possible both to significantly reduce the cost of the raw material for the card, whilst increasing the possibility of using very high production rates which alone make it possible to obtain low cost prices for such a card.

For this purpose, the invention proposes an integrated circuit card of the type described above, characterised in that the card has an interface terminal strip provided with a series of terminals electrically connected to terminals on the integrated circuit, and in that the contact areas are formed on the top face of the card body so that each area has a portion which covers (or contacts) at least partly a terminal on the interface terminal strip so as to electrically connect the said contact area to the said terminal on the terminal strip.

Thus a technique for the economical production of contact areas (by the deposition of conductive ink) is combined with the use of a smaller module on which the chip has its pads connected to terminals of sufficiently large size to allow easy connection with the contact areas by means of a deposition of ink.

The invention also has the advantage of increasing the yield in obtaining modules from the same support strip.

According to other characteristics of the invention:

the interface terminal strip is formed by cutting a plate element made of conductive material;

the interface terminal strip is formed by cutting a plate element made from metallic material;

the terminal strip and the integrated circuit are assembled in order to form a module received in a recess provided in the card body; and the integrated circuit is fixed to a bottom face of the terminal strip.

Another object of the invention is to propose a method of manufacturing an integrated-circuit card, characterised in that it includes the steps consisting in:

cutting an interface terminal strip from a plate element made of conductive material;

electrically connecting corresponding terminals of the integrated circuit and terminal strip;

arranging the terminal strip and the integrated circuit in a card body so that a top face of the terminal strip lies flush with the level of a top face of the card body;

producing contact areas by the deposition of a conductive ink on the top face of the card body so that each area has a portion which at least partly covers a terminal on the interface terminal strip so as to electrically connect the said contact area to the said terminal on the terminal strip.

According to yet other characteristics of the invention:

the method includes the step consisting in producing a module including the integrated circuit and the terminal strip, and the module is subsequently inserted in a recess provided in the card body;

the method includes the step consisting in producing a module including the integrated circuit and the terminal strip and, subsequently, the card body is moulded on around the module;

the step of producing the module includes the step consisting in cutting, in a plate element, slots demarcating the terminals on the terminal strip, the said terminals each remaining connected to an external contour of the plate element;

the step of producing the module includes the step consisting in fixing the integrated circuit to a bottom face of the terminal strip;

the step of producing the module includes the step consisting in applying, to the bottom face of the terminal strip, a layer of support resin;

the step of producing the module includes the step consisting in separating the module from the plate element by separating each of the terminals on the terminal strip from the contour of the plate element; and the plate element is a strip along which a series of modules are produced.

BRIEF DESCRIPTION OF THE DRAWINGS

Other characteristics and advantages of the invention will emerge from a reading of the following detailed description, for an understanding of which reference should be made to the accompanying drawings, in which.

DETAILED DESCRIPTION

Figure 6:
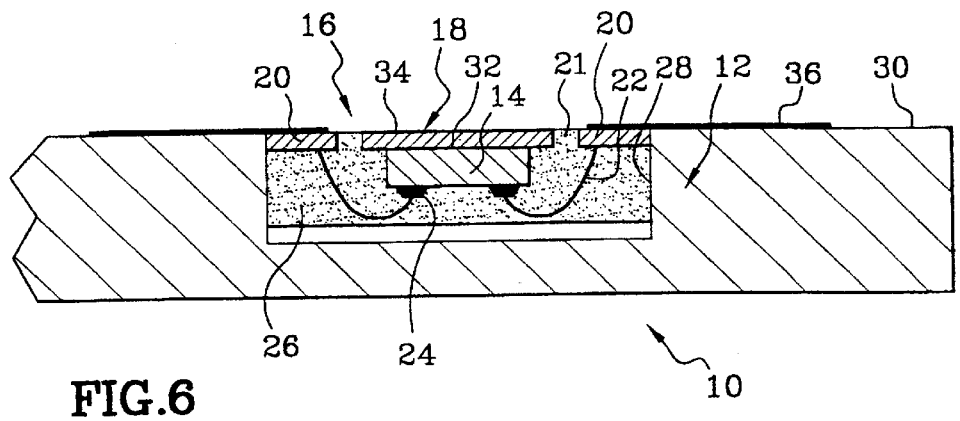
FIG. 6 is a view in section along the line 6—6 in FIG. 7 illustrating a card body in which there is arranged a module incorporating notably the integrated circuit, the interface terminal strip and the encapsulation resin.
Figure 7:
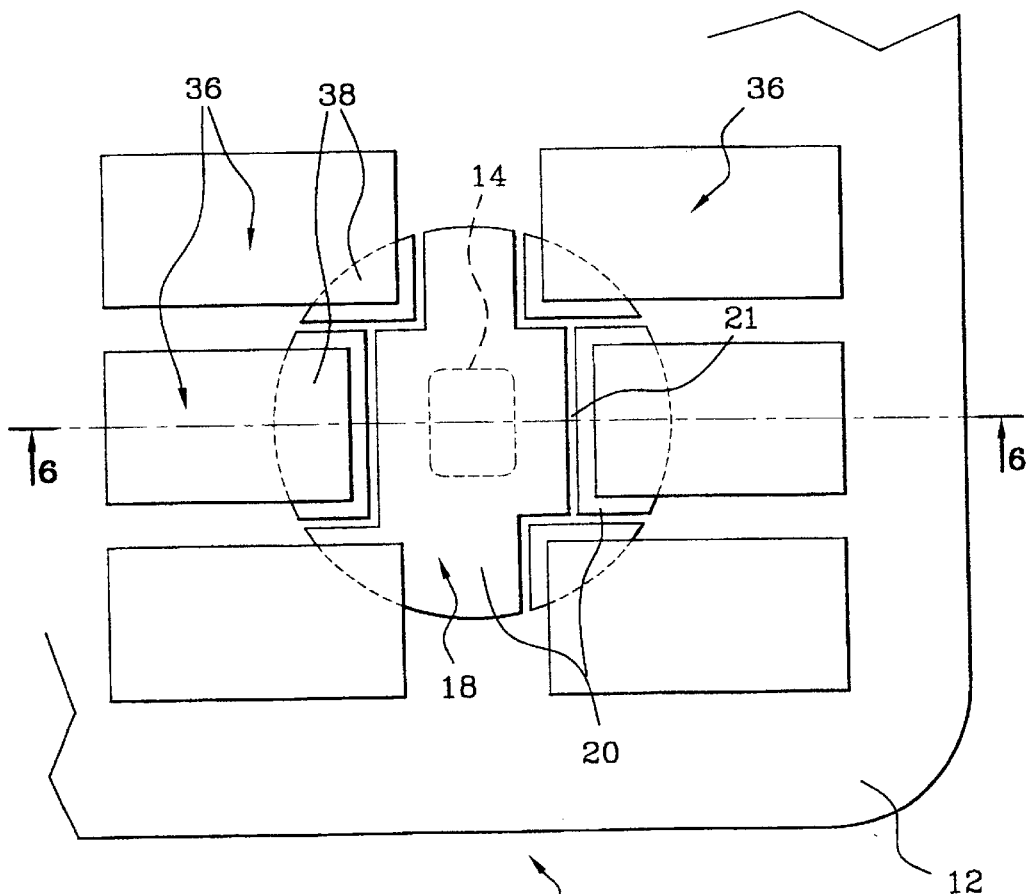
FIG. 7 is a plan view of the card body showing more particularly the contact areas produced by the deposition of conductive ink and a portion of which at least partially overlaps one of the terminals of the interface terminal strip.

FIGS. 6 and 7 depict an integrated circuit card 10, also referred to as a chip card or memory card, which has essentially a card body 12, generally rectangular in shape with rounded corners and produced from plastics material, in which there is arranged at least one so-called integrated circuit 14 known as a chip.

In accordance with the teachings of the invention, the integrated circuit 14 is included in a module 16 (a module reduced in size compared with modules of the conventional type, for example half the size or less) in which the integrated circuit 14 is fixed on the bottom side of a terminal strip 18, including a series of terminals 20, each of which is connected, for example by means of a connecting wire 22, to a pad 24 on the integrated circuit 14. The bottom face of the module 16 is also covered with a layer of encapsulation resin 26 in which the integrated circuit 14 and the wires are embedded so as to ensure their protection.

The module 16 thus formed and which, in the example embodiment, is circular in shape as seen from above, is arranged inside a cavity 28 provided in the card body 12 and which opens out in a top face 30 thereof.

As can be seen in the figures, the integrated circuit 14 is fixed by a top face 32 against a bottom face of a central terminal 20 on the terminal strip 18. Where the integrated circuit requires a connection to an electrical earth, provision will advantageously be made to fix the circuit 14 to the central terminal 20 by means of a conductive glue. In the contrary case, an insulating glue will rather be used.

The connecting wires 22 which electrically connect each of the terminals 20 of the terminal strip 18 to the corresponding pads 24 on the integrated circuit 14 are welded by any normal method, such as ultrasonic welding or thermosonic welding. The terminal strip 18 is produced by cutting a metallic plate element, notably a plate element made from copper possibly covered, by electrolytic deposition, with various metals such as nickel, silver or gold.

Naturally, rather than a connection of the wire type, it may be chosen to electrically connect the electrical circuit to the terminals 20 of the terminal strip 18 by any known electrical connection method used up to the present time in the context of the electrical connection of an integrated circuit to the contact areas of the card when these are produced in a known manner by cutting from a plate element made of conductive material. One example of these alternative techniques is for example the one known to persons skilled in the art as "flip-chip".

As can be seen in FIG. 6, the module 16 is engaged in the cavity 28 so that the top face 34 of the terminals 20 on the terminal strip 18 lies flush at the same level as the top face 30 of the card body 12. In addition, provision will be made for the module 16 to be received with a minimum clearance in the cavity 21, or even with a slight grip, so that there is no discontinuity between the top face of the module 16 and that of the card body 12.

As can be seen notably in FIG. 7, each terminal 20 on the terminal strip 18 is electrically independent of the others, the terminals 20 being separated from the others by demarcation slots 21.

In this way it is possible to produce, on the top face 30 of the card body 12, contact areas 36 whose shape and size are in accordance with a particular standard governing a particular type of integrated circuit card.

These contact areas 36 are produced by the deposition of a conductive ink, for example by screen-printing, offset, flexographic printing or pad printing.

These techniques, which will be referred to under the generic term printing techniques, make it possible to produce, at very high rates, contact areas 36 which require only a very small amount of raw material given their very small thickness which, in FIG. 6, has been deliberately exaggerated for more clarity in representation.

In accordance with the teachings of the invention, each of the contact areas 36 which is intended to afford electrical connection between the integrated circuit and an operating circuit includes at least one portion 38 which covers at least part of one of the terminals 20 of the terminal strip 18.

Thus, the conductive ink being deposited on the top surface of the corresponding terminal, the contact areas 36 are electrically connected to the terminals 20 of the terminal strip 18 and, by means of connecting wires 22, to the pads 24 of the integrated circuit 14.

Thus, by virtue of the invention, it is possible to produce integrated circuit cards on which the module 16 which incorporates the integrated circuit 14 and terminal strip 18 is of particularly small size compared with the modules known up to the present time, whose minimum size is that imposed by the shape of the standard contact areas 36.

Likewise, the invention makes it possible to significantly reduce the quantity of material used, whether with regard to the metallic plate from which the terminal strip 18 is cut, or with regard to the encapsulation resin 26.

A description will now be given of a method of manufacturing an integrated circuit card according to the teachings of the invention.

Figure 1:
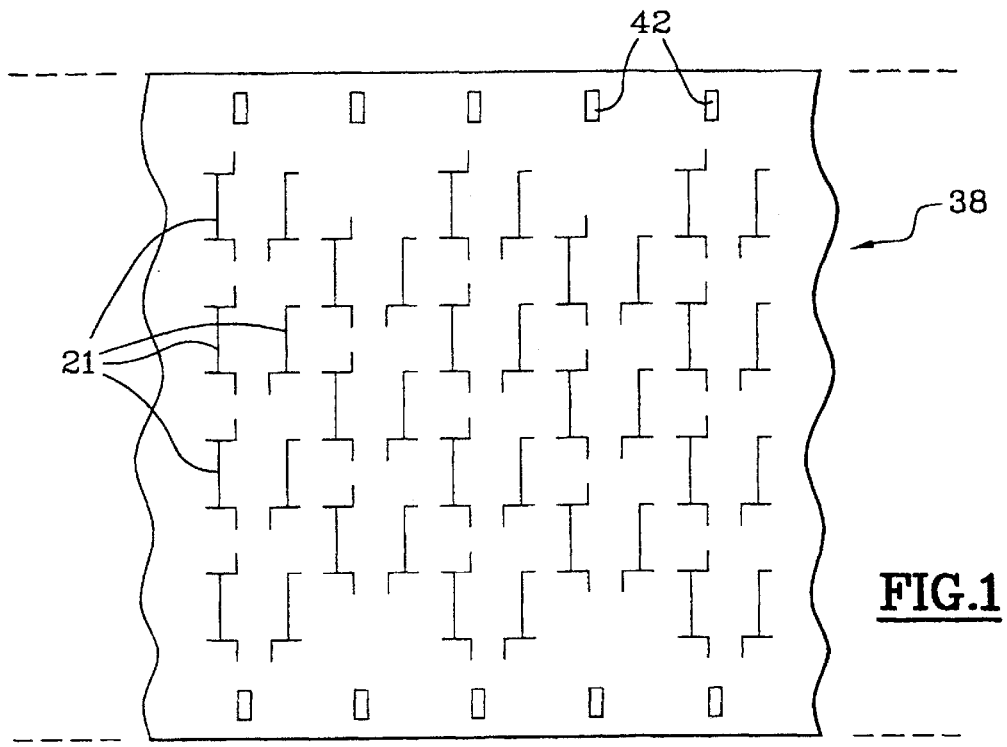
FIG. 1 illustrates schematically and in plan view a metallic strip in which there are provided slots demarcating the terminals of the terminal strip.

In a first step of this method, illustrated in FIG. 1, there are cut in a metallic strip 38 demarcation slots 21 which are intended to demarcate terminals 20 in a series of modules 18 distributed over the strip 38.

Figure 2:
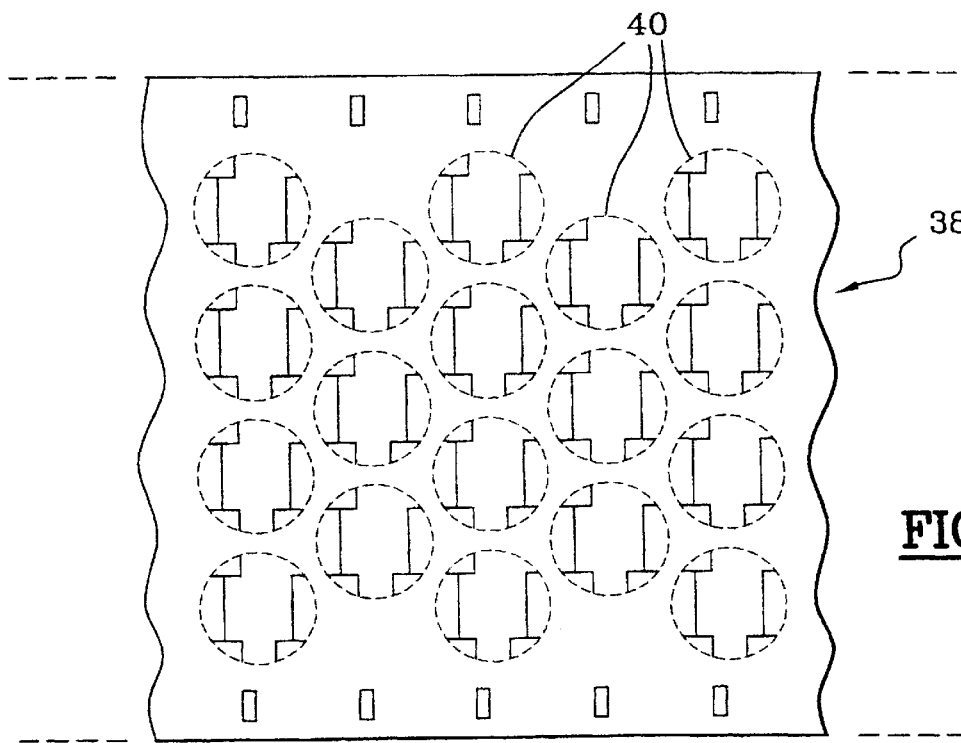
FIG. 2 is a view similar to FIG. 1 in which the contour, possibly prescored, of the modules which are intended to be produced on the strip of FIG. 1 have been illustrated.

If required, as illustrated in FIG. 2, it is then possible to carry out a step of scoring the external contour 40 of the module structures 18, which, as can be seen more particularly in this figure, are for example disposed in a staggered fashion with a view to best using the available surface area of the strip 38, and therefore to limit the offcuts of material. It is however entirely possible to dispose four aligned modules in the direction of the width of the strip in order to facilitate management of the cutting and the transfer of the modules, whilst having a constant even number of modules in the direction of the width.

The strip 38 is for example a strip of copper covered with one or more layers of metal, deposited for example by electrolytic deposition, and intended to improve the quality of the electrical contact. The strip 38 has two lateral series of holes 42 pierced along its longitudinal edges, which make it possible to very easily provide for its driving in transfer machines by means of spiked rollers.

Figure 3:
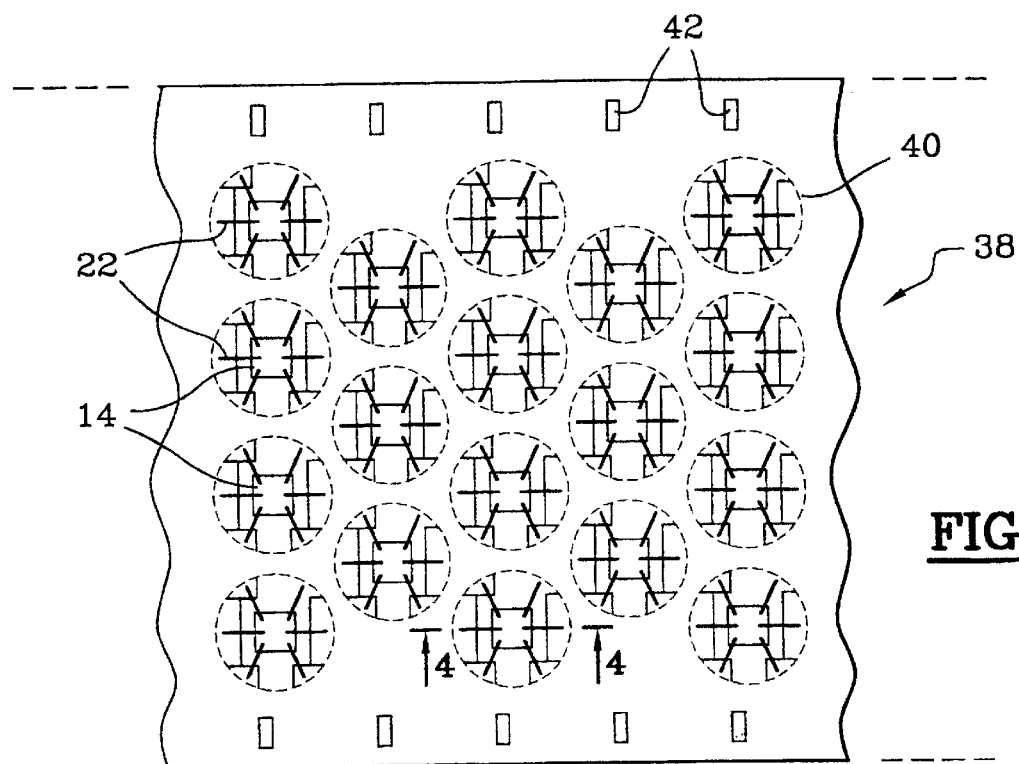
FIG. 3 is a view similar to FIGS. 1 and 2 illustrating the mounting of an integrated circuit on the bottom face of the strip of FIG. 2, and the effecting, for example by wired connection, of the electrical connection between the terminals of the integrated circuit and those of the terminal strip.

In the example illustrated in FIG. 3, an integrated circuit 14 has been fixed to the bottom face of the strip 38, substantially at the centre of each future module 18, and the electrical connection between the output terminals 14 and the terminals 20 of the terminal strip 18 is effected.

Figure 5:
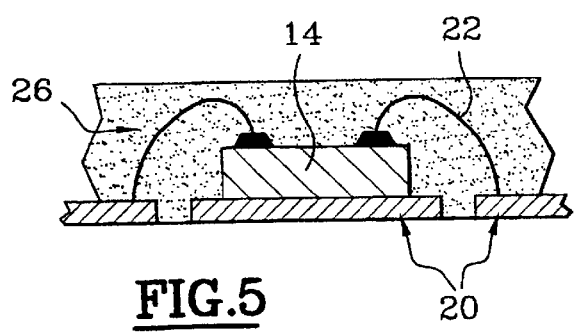
FIG. 5 is a view similar to that of FIG. 4 illustrating an integrated circuit once its encapsulation has been effected by means of a protective resin.

FIG. 5 illustrates partially the strip 38 after there has been deposited, on the bottom face of the terminal strip 18, an encapsulation resin which is intended both to protect the integrated circuit 14 and the connecting wires 22 where the electrical connection between the circuit 14 and the terminal strip 18 is effected in this manner, but also to ensure the holding and fixing of the different terminals 20 of the terminal strip 18 when the latter is cut along its contour 40, then leaving no continuity of material between each of the terminals 20.

The encapsulation resin can be deposited by various known methods.

According to a first technique, a layer of resin, in a fluid form, whose thickness is controlled for example by scraping or dabbing, is deposited on the entire strip 38. The resin is then cross-linked, for example, according to the nature of the resin, by ultraviolet radiation or by heating.

Naturally, it is important, during this operation, for the top face 34 of the terminals 20 to remain free of any trace of resin in order to be able to provide the electrical connection with the contact areas 36. To this end, provision can be made to press the top face of the terminal 18 against a conveyer belt, for example by suction, or provision can be made for covering this top face of the strip with an adhesive which will subsequently be detached.

In a variant of this method, it is possible, instead of applying a layer of resin to the entire width of the strip, to deposit resin in the form of one or two drops, which solely cover the parts of the strip 38 which are actually intended to form the modules 16. This variant, known as the "glob top" process, may possibly require carrying out a milling step subsequent to the cross-linking of the resin, in order to ensure perfect control of the thickness of the layer of resin. However, this variant of course makes it possible to significantly reduce the quantity of resin consumed.

According to another method of depositing the encapsulation resin, this operation can also take place in the form of a moulding by bringing in contact with the bottom face of the strip 38 mould walls in which the resin is injected and cooked in order to obtain its hardening.

At this stage of manufacture, there is therefore a strip 38 of module 16, a strip which it is possible to wind in a coil.

At this time, it is possible to individually separate each micromodule, using a cutting method having recourse for example to a punch and die, or a laser beam.

The module thus formed is then engaged, during a so-called insertion operation, in the cavity 28 of the card body 12. The cavity 28 can be produced either during moulding, where the card body is produced by injection moulding, or by machining.

The module 16 can be fixed in the cavity 28 either by gluing, or simply by gripping. This is because provision is made for the module 16 to be received with sufficient grip in the cavity 28.

During the insertion operation, it is necessary to correctly control the positioning in depth of the module 16 in the cavity 28 in order to obtain a perfect flush fit between the top face 38 of the terminals 20 and the top face 30 of the card body 12.

As a variant, provision can also be made for the card body 12 to be moulded on around the module 16 which, in this case, is arranged in the mould of the card before the injection of the material. This variant guarantees the correct relative positioning of the top faces 30, 34 of the card body 12 and module 16.

Figure 4:
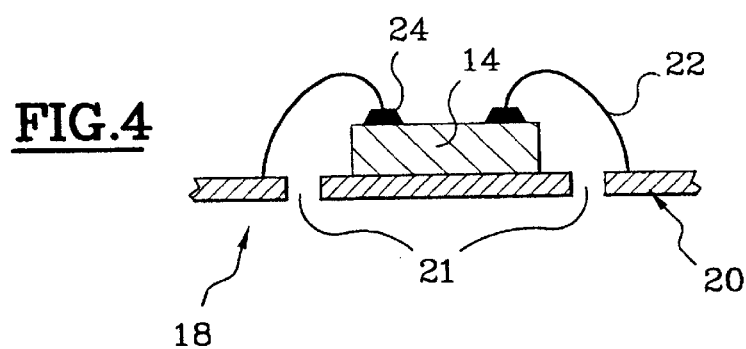
FIG. 4 is a partial view in section along the line 4—4 in FIG. 3.

In another variant of the method of producing the card according to the invention, the module 16 is cut from the strip 38 just after the steps illustrated in FIGS. 3 and 4, that is to say before the bottom face of the terminal 18 is covered with an encapsulation resin. In this case, in order to maintain a suitable relative position of the terminals 20 of the terminal strip 18, it is necessary to dispose, for example on the top face of the terminal strip 18, before it is cut along the contour 40, an adhesive tape. The module thus produced, with no encapsulation resin, is intended to be received in a cavity in the card body which is stepped. In a peripheral part, the depth of this cavity corresponds exactly to that of the terminal strip 18, that is to say corresponding to the thickness of the strip 38. In a central part, the cavity has a greater depth and is filled with a resin which is not yet cross-linked so that, when the module is inserted in the card body 12, the integrated circuit 14 and the connecting wires 12 come to be embedded in the resin previously deposited in the cavity.

In all cases, once the card body 12 is provided with the module 16 whose terminals 20 fit flush with the top surface 30 of the card body 12, it is possible to produce the contact areas 36 according to any suitable method of printing a conductive ink. The printing technique will be chosen so as to allow extremely high production rates.

The ink is deposited so that the contact areas 36 extend partly over one of the terminals 20 of the terminal 18 and partly over the top face of the card body 12. Naturally, the shape of the conductive areas 36 must cover at least the surface areas defined by the standard, but they can if necessary exceed these minimum standards.

The conductive ink can be either a polymer resin containing conductive particles, such as an epoxy resin containing particles of silver, copper or gold, or an intrinsically conductive polymer.

In both cases, the polymer can be either thermosetting, or a thermoplastic, or a mixture of the two.

The ink can be a solvent ink, a single or dual-component thermosetting ink or an ink which is polymerisable under ultraviolet radiation.

The conductive ink can be deposited by screen-printing, or by inkjet or pad printing using an inking pad with vertical or rotatory movement, or by an offset technique using a roller of the blanket type for transferring ink onto the card and module.

The conductive ink used can consist of a solder paste or a metallic alloy.

The conductive ink can preferably comprise a flexible material able to absorb deformations without the electrical contact being broken during flexion of the card.

In another embodiment of the invention, not shown, the manufacturing steps can be reversed and a slightly different printing can be used.

According to this embodiment, the card body is printed in such a way that the conductive ink tracks go down at least partly on the sides of the cavity. If the conductive ink is a polymer containing conductive particles, care will taken at this stage not to dry or cross-link the ink. The module is then inserted in the cavity so that the sides of each of the contacts enter the layer of ink, so as to provide an electrical connection between each of the contacts of the module and the tracks printed with conductive ink.

The card then undergoes a heat treatment so as to either dry (solvent ink), cross-link (thermoplastic polymer) or reactivate (in the case of a thermoplastic polymer or solder paste) the conductive ink. The electrical connection is thus fully ensured.

Naturally, the invention can also be implemented in order to produce a card of the "combi-card" type in which the integrated circuit can also communicate at a distance with the operating circuit by means of a link of the radiofrequency type, the card then having, in addition to the contact areas, an antenna which is electrically connected to the integrated circuit and which is generally produced by the deposition of a conductive ink.

According to one variant, the top face (34) of the terminal strip can be not flush with the level of the top face (30) of the card body (12) as in the example described, but intentionally be recessed with respect to it. Where applicable, an encapsulation resin filling in the recess is disposed.

What is claimed is:

1. An integrated circuit card, comprising:
   a card body having a cavity;
   a set of contacts on a surface of said card body that conform in size to an established standard; and
   a module disposed in said cavity at said surface and having a size smaller than said standardized size, said module including an integrated circuit and a connector interface of metallic sheet material having a plurality of terminals that are electrically connected to pads on said integrated circuit;
   wherein said contacts are formed by a conductive ink and cover at least a portion of said terminals and a portion of said surface of said card body.

2. The integrated circuit of claim 1, wherein said connector interface of said module is flush with said surface.

3. The integrated circuit of claim 1, wherein said module is disposed in said cavity so that said connector interface is situated below said surface to form a recess, and further including an encapulation resin in said recess.

4. The integrated circuit of claim 1, wherein the size of said module is no larger than one-half of said standardized size.

5. The integrated circuit card of claim 1 wherein said conductive ink comprises a flexible material that is capable of absorbing deformations without breakage.

6. A method for manufacturing an integrated circuit card, comprising the following steps:
   providing a card body having a cavity therein;
   forming a module comprising an integrated circuit and a connector interface made of metallic sheet material having a plurality of terminals that are electrically connected to pads on said integrated circuit, said module having a size which is smaller than an established standard size for contacts on an integrated circuit card;
   inserting said module in said cavity so that said connector interface is disposed at a surface of said card body; and
   depositing a conductive ink to form contacts that conform in size to said standard and cover at least a portion of said terminals and a portion of said surface of said card body.

7. The method of claim 6 wherein the step of forming the module includes providing slits in a metallic sheet material to define said terminals.

8. The method of claim 6 wherein said conductive ink is deposited by means of inkjet printing.

9. The method of claim 6 wherein said conductive ink is deposited by means of an inking pad with vertical or rotary movement.

10. The method of claim 6 wherein said conductive ink is deposited by means of an offset technique using a roller for transferring ink onto said surface and said terminals.

11. The method of claim 6 wherein said depositing step includes printing tracks of conductive ink that extend at least partly along the sides of the cavity, and said inserting step includes inserting the module in the cavity so that each terminal penetrates the ink in said tracks to provide electrical contact, and further including the step of hardening the ink after said inserting step.

* * * * *